United States Patent
Gasworth

(10) Patent No.: US 8,203,103 B2
(45) Date of Patent: Jun. 19, 2012

(54) PLASMA ARC COATING SYSTEM AND METHOD

(75) Inventor: Steven M. Gasworth, Farmington Hills, MI (US)

(73) Assignee: Exatec LLC, Wixom, MI (US)

( * ) Notice: Subject to any disclaimer, the term of this patent is extended or adjusted under 35 U.S.C. 154(b) by 0 days.

(21) Appl. No.: 13/048,218

(22) Filed: Mar. 15, 2011

(65) Prior Publication Data

US 2011/0165333 A1 Jul. 7, 2011

Related U.S. Application Data

(62) Division of application No. 12/406,166, filed on Mar. 18, 2009, now Pat. No. 8,049,144, which is a division of application No. 10/910,143, filed on Aug. 3, 2004, now Pat. No. 7,521,653.

(51) Int. Cl.
*H05B 1/02* (2006.01)
(52) U.S. Cl. .................. 219/483; 219/486; 219/121.55; 219/76.16
(58) Field of Classification Search ............. 219/121.47, 219/76.15, 76.16, 121.48, 121.59
See application file for complete search history.

(56) References Cited

U.S. PATENT DOCUMENTS

| | | | |
|---|---|---|---|
| 4,037,074 A | 7/1977 | Montbrun et al. | |
| 4,957,061 A | 9/1990 | Ando et al. | |
| 5,047,612 A | 9/1991 | Savkar et al. | |
| 5,239,161 A | 8/1993 | Lang | |
| 5,993,915 A | 11/1999 | Krebsbach | |
| 6,259,072 B1 | 7/2001 | Kinnard et al. | |
| 6,397,776 B1 | 6/2002 | Yang et al. | |
| 6,947,802 B2* | 9/2005 | Picard et al. | 700/117 |
| 6,948,448 B2 | 9/2005 | Schaepkens | |
| 7,173,216 B2 | 2/2007 | Ptak | |
| 7,521,653 B2 | 4/2009 | Gasworth | |
| 2001/0022295 A1 | 9/2001 | Hwang | |
| 2002/0187371 A1 | 12/2002 | Nakajima | |
| 2003/0097988 A1 | 5/2003 | Schaepkens | |
| 2003/0099784 A1 | 5/2003 | Schaepkens | |
| 2004/0200417 A1 | 10/2004 | Hanawa et al. | |
| 2005/0202184 A1 | 9/2005 | Iacovangelo et al. | |

(Continued)

FOREIGN PATENT DOCUMENTS

EP 0887437 A2 12/1998

(Continued)

OTHER PUBLICATIONS

International Search Report and Written Opinion of the International Searching Authority; International Application No. PCT/US2004/035572; International Filing Date: Oct. 27, 2004; 16 pages.

(Continued)

*Primary Examiner* — Mark Paschall
(74) *Attorney, Agent, or Firm* — Cantor Colburn LLP

(57) ABSTRACT

In an embodiment an apparatus for coating a substrate comprises: an array of plasma arcs; a first plurality of reagent manifolds located upstream of the array of plasma arcs and a second plurality of reagent manifolds located downstream of the array of plasma arcs, each manifold having at least one orifice through which a reagent is ejected into a plasma jet issuing from a respective plasma arc; and a controller which modulates the flow of reagent to each manifold according to the contours of the substrate and to the substrate position relative to the plasma arcs and the manifolds.

14 Claims, 5 Drawing Sheets

U.S. PATENT DOCUMENTS

| | | |
|---|---|---|
| 2006/0029746 A1 | 2/2006 | Gasworth |
| 2006/0156983 A1 | 7/2006 | Penelon et al. |
| 2007/0215596 A1 | 9/2007 | Wintenberger et al. |
| 2008/0160205 A1 | 7/2008 | Gasworth |
| 2008/0286492 A1 | 11/2008 | Gasworth |

FOREIGN PATENT DOCUMENTS

| | | |
|---|---|---|
| EP | 1006216 A2 | 6/2000 |
| WO | 9632846 A1 | 10/1996 |
| WO | 2004015348 A1 | 2/2004 |
| WO | 2004076716 A1 | 9/2004 |
| WO | 2005087977 A1 | 9/2005 |

OTHER PUBLICATIONS

International Search Report and Written Opinion of the International Searching Authority; International Application No. PCT/US2007/089084; International Filing Date: Dec. 28, 2007; 13 Pages.

International Search Report and Written Opinion of the International Searching Authority; International Application No. PCT/US2008/064137; International Filing Date: May 19, 2008; 12 Pages.

"High-Rate Deposition of Abrasion Resistant Coatings Using a Dual-Source Expanding Thermal Plasma Reactor," by M. Schaepkens et al., General Electric Global Research Center, New York, J. Vac. Sci Technol. A 21(4), Jul./Aug. 2003, 6pp.

* cited by examiner

PLASMA ARC COATING SYSTEM AND METHOD

CROSS REFERENCE TO RELATED APPLICATIONS

The present application is a Divisional of U.S. patent application Ser. No. 12/406,166, filed Mar. 18, 2009, now U.S. Pat. No. 8,049,144, which is a Divisional of U.S. patent application Ser. No. 10/910,143, filed Aug. 3, 2004, now U.S. Pat. No. 7,521,653, the contents of each of which are incorporated herein by referenced thereto.

BACKGROUND

The present invention generally relates to a system for coating substrates. More specifically, the invention relates to a plasma arc coating system.

Existing multi-plasma arc coaters incorporate resistive heaters to pre-heat a substrate before it enters into a coating chamber or station. These heaters extend over a large distance in the direction of substrate motion. Further, these heaters have poor spatial resolution in the direction transverse to substrate motion, and have a slow thermal response time relative to the substrate residence time at the heater station.

Many coating stations continuously supply reagent during the coating process, such as coating stations that employ ring manifolds for individual plasma arcs or racetrack manifolds for arc arrays. These manifolds, however, do not allow the upstream and downstream injection orifices to be fed and switched on and off independently of one another.

Moreover, in certain coating stations, arcs and manifolds are placed on opposite sides of the coating station to coat both sides of the substrate, which requires balancing opposing jets to minimize or prevent overspray. However, in a two-sided coating station, balancing opposing jets is difficult to achieve and generally can not consistently be maintained during production runs. Therefore, the opposing jets mix when the jets are not fully intercepted by a substrate, resulting in condensing precursors originating from arcs on opposite sides of the substrates.

SUMMARY

In an embodiment an apparatus for coating a substrate comprises: an array of plasma arcs; a first plurality of reagent manifolds located upstream of the array of plasma arcs and a second plurality of reagent manifolds located downstream of the array of plasma arcs, each manifold having at least one orifice through which a reagent is ejected into a plasma jet issuing from a respective plasma arc; and a controller which modulates the flow of reagent to each manifold according to the contours of the substrate and to the substrate position relative to the plasma arcs and the manifolds.

In an embodiment a method of coating a substrate with a reagent comprises: ejecting a reagent from a first plurality of reagent manifolds located upstream of an array of plasma arcs; ejecting the reagent from a second plurality of reagent manifolds located downstream of the array of plasma arcs, each of the manifolds of the first and second plurality of reagent manifolds having at least one orifice through which a reagent is ejected into a plasma jet issuing from a respective plasma arc; and modulating the flow of reagent to each manifold with a controller according to the contours of the substrate and to the substrate position relative to the plasma arcs and manifolds Further features and advantages will become readily apparent from the following description, and from the claims.

DETAILED DESCRIPTION

Figure 1:
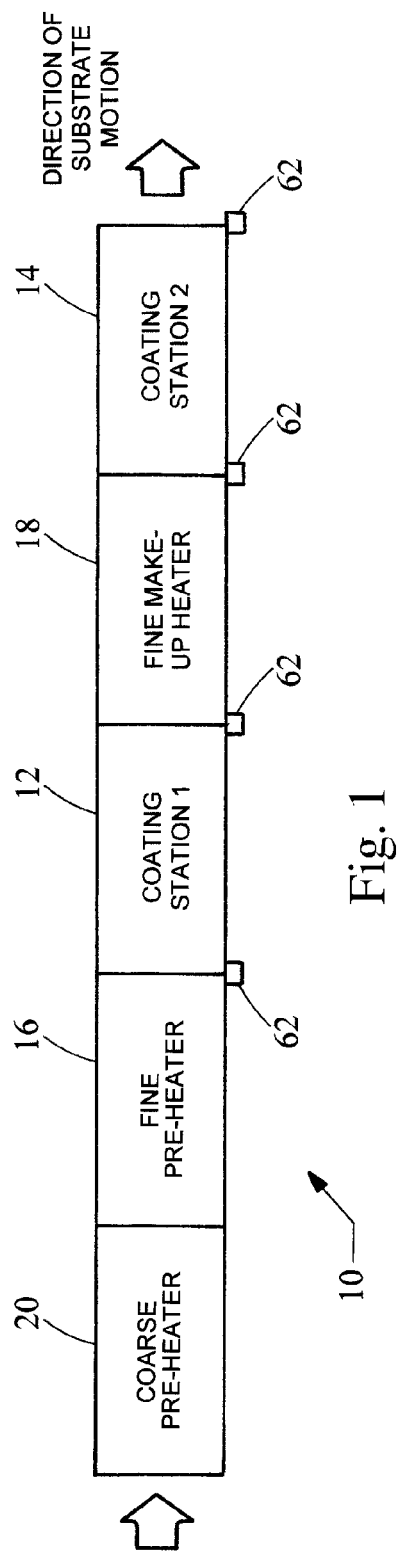
FIG. 1 depicts a system for coating a substrate in accordance with an embodiment of the invention.

Referring now to FIG. 1, a system 10 for plasma coating substrates is shown in accordance with an embodiment of the present invention. As its primary components, the system 10 includes a coating station 12, a coating station 14, a fine heater 16, a fine make-up heater 18 located on the entrance side of the coating station 14, and a coarse heater 20 located on the entrance side of the fine heater 16.

Figure 2:
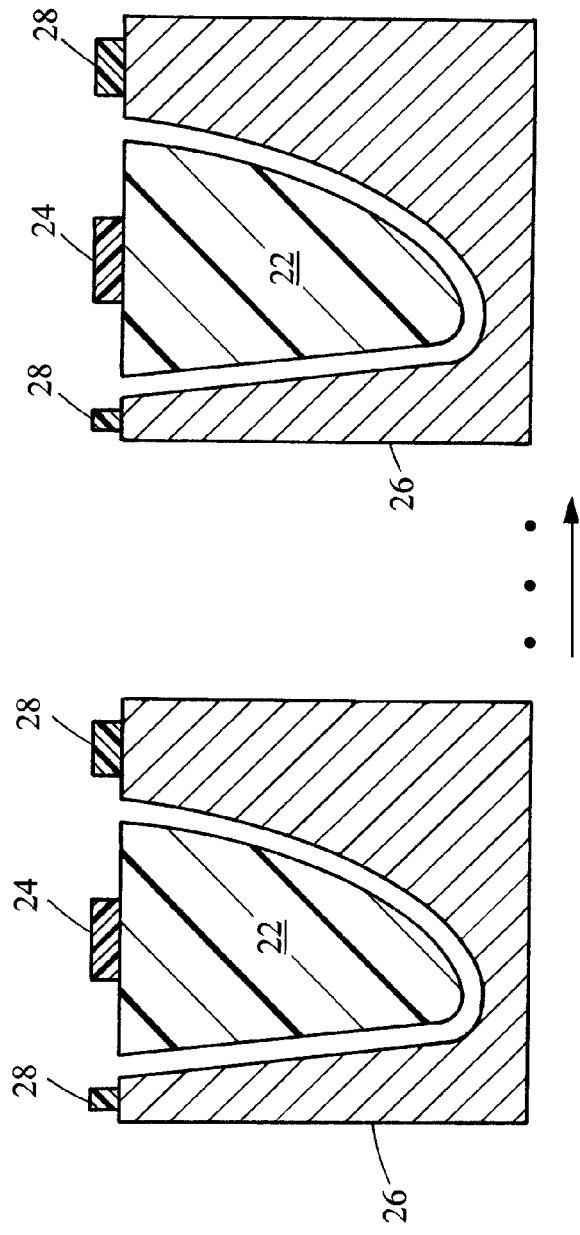
FIG. 2 depicts the substrate with a filler that advances through the system of FIG. 1.

Referring also to FIG. 2, various configurations of the system 10 involve impinging an activated reagent, or, in some implementations, activated reagents, on one or both sides of a substrate 22 as it advances through the coating stations 12, 14. The substrate 22 can be a rear window, a roof panel or other component of a vehicle. The substrate 22 can be made of polycarbonate. The heaters 16 and 20 ensure that the substrate 22 is at the appropriate temperature before entering the coating station 12 and the heater 18 re-heats the substrate 22 to make up for any heat loss during transit before entering the subsequent coating station 14.

Each substrate 22 is attached to a conveyor system by a tab 24. In certain implementations, a filler 26 is also attached to the conveyor system by a set of tabs 28. Alternatively, the substrate 22 can be mounted to a respective filter 26.

The filler 26 is closely spaced such that it is a virtual extension of the edge of the substrate 22. The filler 26 is a disposable or re-useable part made from, for example, polycarbonate or aluminum that forms a border around the substrate 22. In such a configuration, the filler 26 acts a collector of extraneous heat and coating material. As such, use of the filler promotes uniform temperature and coating thickness over the substrate. In particular embodiments, the temperature over the substrate 22 is about 65° C.±10° C. at the entrance of the coating station 12, and the coating thickness is between about 2 µm to 3 µm after the coating station 14, as the conveyor system moves the substrates (and optionally the fillers) through the system 10 at a speed of about 2.5 cm/s. Continuous flow of the coating reagents into the manifolds results in wastage of material between the substrates. Moreover, that continuous flow creates extra cleaning and maintenance burdens.

Various embodiments of the system 10 are able to reduce the tendency for relatively thick plasma coating at the edges of the substrate, where greater coating thicknesses tend to occur relative to the center of the substrate 22. Since there is a preferred range for the coating thickness (that is, not too thin, which compromises abrasion-resistance, and not too thick, which compromises water immersion performance), it is desirable to minimize thickness variability across the substrate so as to make the coating process more robust. The relatively thick coating at the edges is a probable contributing factor to less robust water immersion performance at the edges of the substrates.

Further, the system 10 minimizes extraneous coating material on the vacuum chamber walls of the coating stations 12, 14 (and on the fillers 26 when they are employed), when there are gaps between successive substrates, which occurs when the adjacent trailing and leading edges of successive substrates do not nest because of their different contours, or because the substrate transport system provides for independent motion or articulation of substrates to accommodate complex shapes or to accommodate a combination of a stationary heating step with a scanning coating step.

Figure 3A:
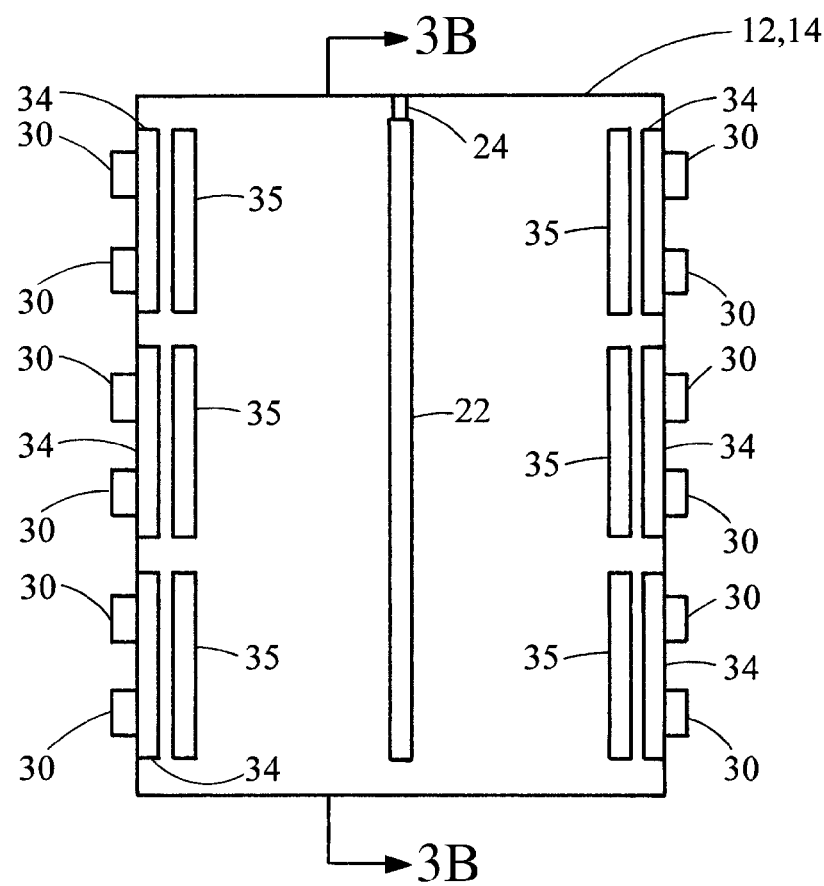
FIG. 3A depicts a coating station of the system of FIG. 1 in accordance with an embodiment of the invention.
Figure 3B:
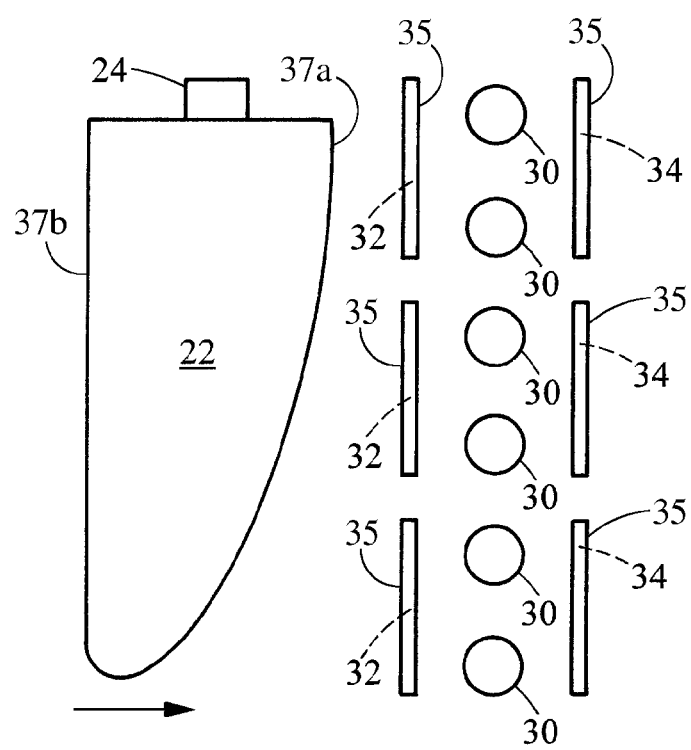
FIG. 3B is a view of the coating station of FIG. 3A taken along the line 3B-3B.

Referring now to FIGS. 3A and 3B, each coating station 12, 14 includes a vacuum chamber with a plurality, for example, of six plasma arcs 30 on each side of the vacuum chamber. Each station 12, 14 further includes an upstream reagent manifold segment 32 and a downstream reagent manifold segment 34 associated with, for example, a pair of arcs. As such, each side of the coating station chamber is provided with three upstream reagent manifold segments 32 and three downstream reagent manifold segments 34. Various embodiments of the coating stations 12, 14 involve injecting coating reagents through the manifold segments 32, 34 independently of one another. A set of oxygen manifold segments 35 are also associated with respective manifold segments 32, 34. A simple control mechanism can be employed to switch the oxygen manifold segments 35 on and off individually, or a combination of two or more oxygen manifold segments 35 can be operated together.

Figure 4:
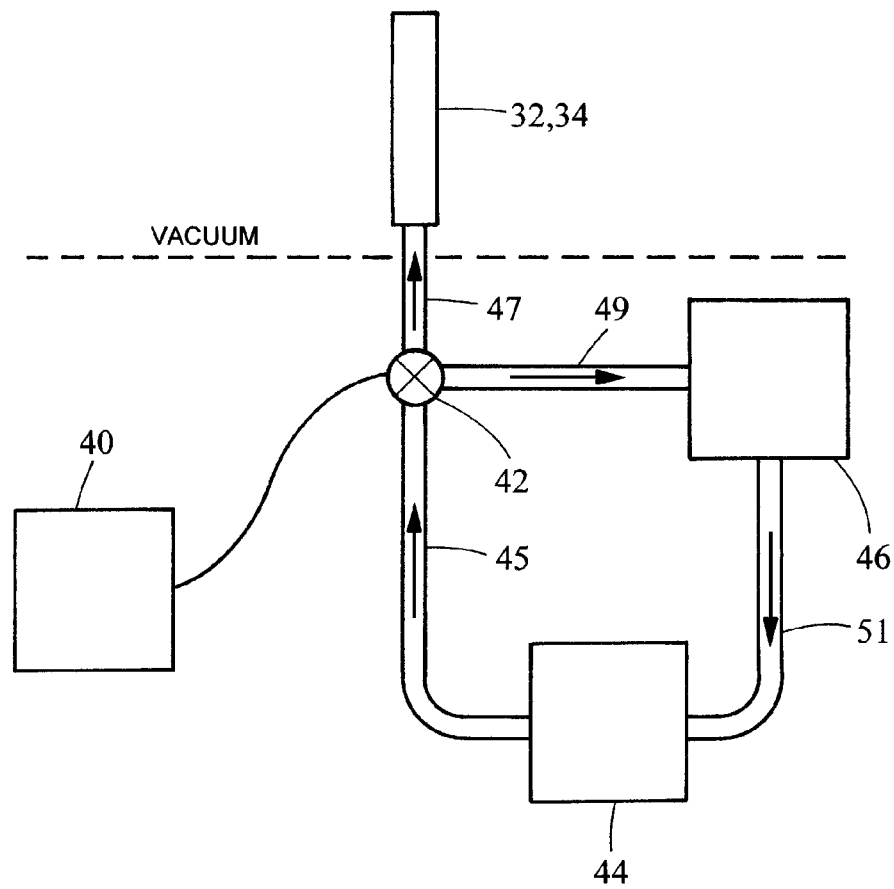
FIG. 4 depicts a reagent manifold segment with a valve system for the coating station of FIGS. 3A and 3B in accordance with an embodiment of the invention.

As shown in FIG. 3B, the leading edge 37a of an advancing substrate 22 first passes the upstream manifold segments 32, then the array of arcs 30, and finally the downstream manifold segments 34, and the trailing edge 37b is the last portion of the substrate 22 to pass by the downstream manifold segments 34. The arcs 30 are typically fed with an inert gas, such as argon, which is heated to the point of partial ionization and issues into the vacuum chamber as jets (from the respective arcs) directed towards the substrate to be coated. Coating reagents are introduced in vapor form between the arcs and the substrate at a controlled rate by injection orifices distributed on the manifold segments 32 and 34 adjacent to the respective arcs. A controller 40 (FIG. 4) directs the operation of the upstream and downstream manifold segments 32, 34, such that the twelve manifold segments can operate independently of one another according to the profiles of the leading and trailing edges of the substrate 22.

The controller 40 modulates the reagent flows to the respective individual manifold segments 32, 34 according to the position of the substrate edge relative to a particular manifold segment. Specifically, the controller 40 directs the operation of a three-way valve 42 associated with each manifold segment. The valve 42 either directs vaporized reagent from a reservoir 44 that is shared by multiple manifold segments to the respective manifold segments via conduits 45 and 47 or diverts the reagent away from the associated manifold segments, providing for rapid modulation of reagent flow to the manifold segments 32, 34 and associated jets while the reagent flow from the reservoir 44 continues uninterrupted. The diverted flow can be directed, via a conduit 49, into a relatively cool condensation vessel 46, also shared by multiple manifold segments, that condenses the reagent vapor, which can then be recycled into the primary liquid reagent reservoir 44 via an optional conduit 51. In sum, the valve 42 modulates the reagent flow to the respective individual manifold segments 32 or 34 by directing the continuous reagent flow from the reservoir 44 either to the manifold segment or to the condensation vessel 46 for recycling. The close proximity of the valve to the wall of the vacuum chamber (indicated by the dashed line) is intended to minimize the volume of residual vaporized reagent between the valve 42 and the manifold segment immediately after the vapor flow has been switched to the condensation vessel 46. The residual vapor can continue to flow into the manifold 32 or 34 after the valve 42 is switched to divert the flow away from the manifold, which may be undesirable since the residual vapor flow tends to limit the effective speed of response of the flow modulation means. Although the reservoir 44 and the condensation vessel 46 are described above as being shared by multiple manifold segments, the reservoir 44 and the condensation vessel 46 can be associated with a single manifold segment.

Thus, the system 10 reduces or minimizes excess coating at the edges of substrates by modulating reagent flow to the upstream and downstream manifolds, according to specific protocols, as a leading or trailing substrate edge crosses in front of a respective array of arcs 30. Reagent flows to a manifold only when there is a substrate present, reducing the flux of coating precursors during edge coating and limiting the opportunity for coating precursors originating on one side of the substrate to reach the opposite side. The optimum timing of the individual switching events, expressed in terms of a local edge position relative to the individual manifolds, can be determined empirically. The desired timing can then be easily implemented, since it is only a matter of equipment design to provide for tracking of the position of the substrate with sufficient accuracy and resolution.

Accordingly, the system 10 minimizes extraneous coating on the vacuum chamber walls of the coating stations 12, 14, as well as on the fillers if they are employed, because coating reagent is diverted to the condensation vessel 46 when there are gaps between successive substrates, minimizing the frequency of chamber wall cleaning (and cleaning of fillers if employed) and maximizing utilization of reagent. As mentioned previously, the system 10 improves the uniformity of plasma coating thickness, making the plasma coating process more robust with respect to upper and lower specification limits for coating thicknesses.

As shown in the illustrated embodiment, each coating station includes six upstream and six downstream manifold segments. However, depending on the application, each station may include greater or fewer segments. The manifolds are segmented to accommodate a variety of contours of substrate edges. With the arc array oriented transverse to the direction of substrate motion, different segments of a contoured substrate edge generally pass the arc array at different times. Segmenting the manifolds provides for local flow switching according to a desired protocol.

Note that non-uniform substrate temperature is promoted by preferential heating of substrate edges, by variations in substrate thickness, and by substrate shape complexity. There is, however, a preferred range for substrate temperature for the coating process, since a temperature that is too low tends to compromise water immersion performance, and a temperature that is too high risks substrate distortion and thermal damage. Thus, it is desirable to maximize temperature uniformity across the substrate so as to make the coating process more robust. Accordingly, the system 10 provides for improved consistency of plasma coating performance across a substrate by improving substrate temperature uniformity during the coating process.

Figure 5A:
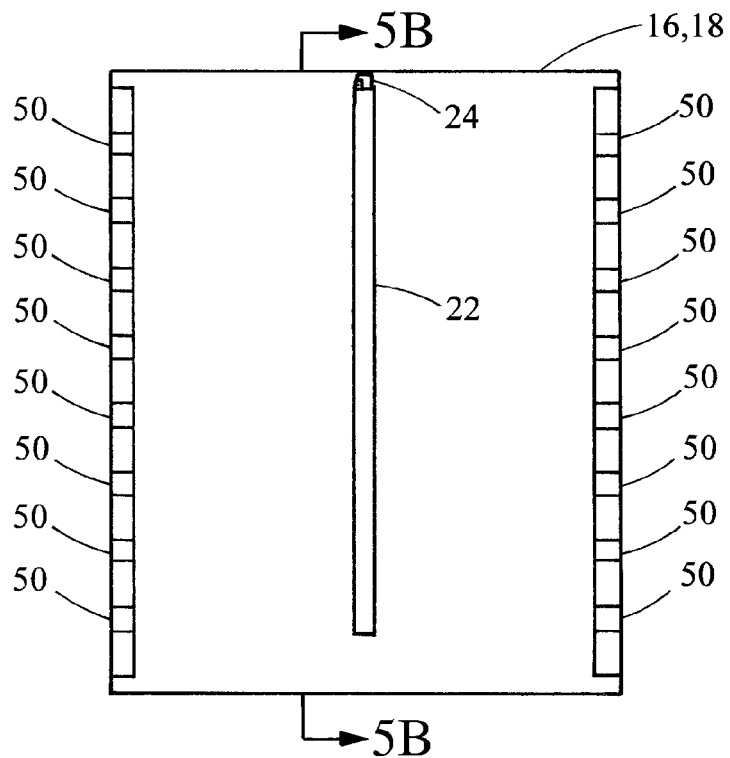
FIG. 5A depicts a fine heater of the system of FIG. 1 in accordance with an embodiment of the invention.
Figure 5B:
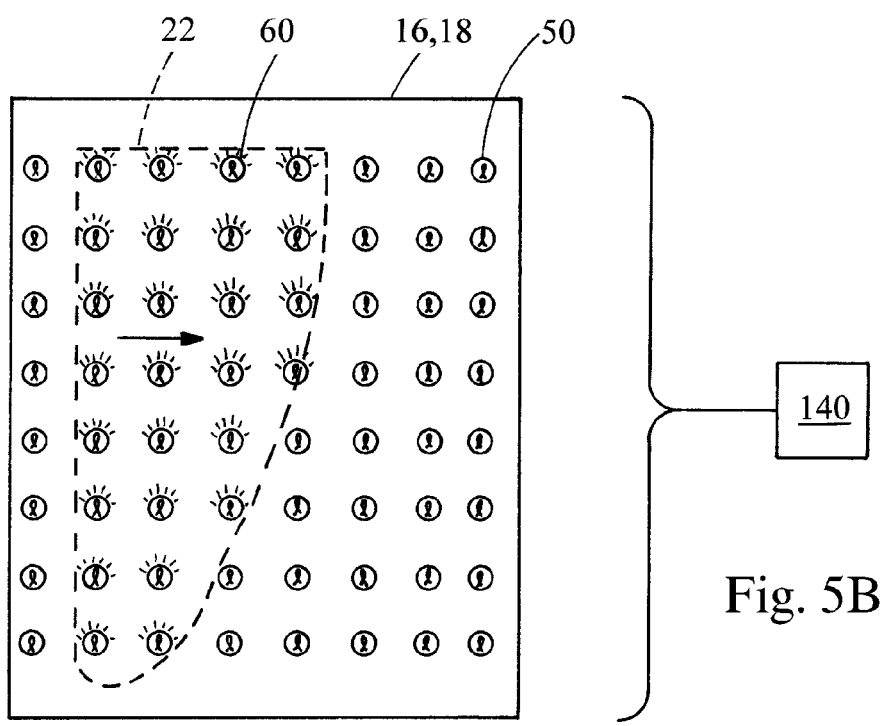
FIG. 5B is a view of the heater of FIG. 5A taken along the line 5B-5B.

Referring back to FIG. 1, as well as to FIGS. 5A and 5B, each of the fine heater 16 and fine make-up heater 18 includes a programmable two-dimensional array of heat sources 50 positioned on each of the opposing walls of the heaters. The heat sources 50 are under the direction of a controller 140 and are programmable with a fast response time relative to the substrate residence time in the heater and produce a small spot size (i.e., the heated area on the substrate at a working distance of up to several inches) relative to characteristic dimensions of the substrate. The fast response times of the heat sources allow controlled heating of the substrate to produce a desired substrate temperature profile for the coating process and also minimization of waste heat. Arranged as an array, the heat sources 50 are capable of projecting a contiguous heated area onto a passing or stationary substrate.

The optional fine make-up heater 18 compensates for cooling of the substrate between the coating stations 12 and 14 and provides for controlled substrate temperature profile for the coating station 14, which is analogous to the role of the fine heater 16 with respect to the first coating station 12.

The heat sources 50 provide spatially-resolved heating for a moving or stationary substrate, which can compensate for preferential heating of substrate edges, and for substrate-specific features and shape complexity that tend to promote non-uniform substrate temperatures. Referring in particular to FIG. 5B, as each area element of the substrate 22 is heated by a heat source 50, the instantaneous intensity of that source is adjusted in a programmed fashion according to the desired local temperature of that area element. As such, the heat sources turn on only when the substrate is present, as indicated by the activated heat sources 60.

Note that since substrate heating by the plasma arcs 30 during the coating process may also be non-uniform, it may be desirable to compensate for this by programming the substrate temperature profile after the heaters 16 and/or 18 to be non-uniform in a complementary way. For example, in regions of the substrate that are preferentially heated by the arcs 30 (e.g. a convex surface with a relatively small working distance to the arc array), it may be desirable to leave that region relatively cool during exposure in the fine heater 16, as well as in the fine make-up heater 18.

The fast response time of the programmable array of heat sources 50 facilitates controlling the temperature profile on individual substrates to allow for different treatment of successive substrates, according to their particular features. A further benefit of the fast response time is a more efficient use of heater power and less extraneous heating of the vacuum chamber, and filler if used, since individual heat sources 50 are active only when a substrate is present to absorb the projected heat. The significance of this benefit is increased by shifting more of the heating burden away from the coarse heater 20 and onto the programmable heat sources in the heaters 16 and 18. The heaters 16 and 18 promote temperature uniformity in the substrates during plasma coating, which, in turn, promotes a more robust coating process. Moreover, each side of the substrate to be coated can be exposed to a respective programmable array of heat sources before the coating process; that is, the operation of the array of heat sources 50 on one side of the substrate may be different than that of the opposite array of heat sources in each of the heaters 16 and 18.

Since the operation (both the intensity and the on and off time cycles) of the array of heat sources 50 is fully programmable, the system 10 can accommodate different substrates, for example, substrates with different shapes, sizes, thicknesses, and made from different materials with different thermal responses. This feature of the heat sources 50 is unlike conventional heat sources in that the substrate heating process can be rapidly modulated to minimize wasted power and extraneous heating of the vacuum chamber, and of the filler if used, and can be substrate specific to promote a narrow substrate temperature range during coating.

Figure 6A:
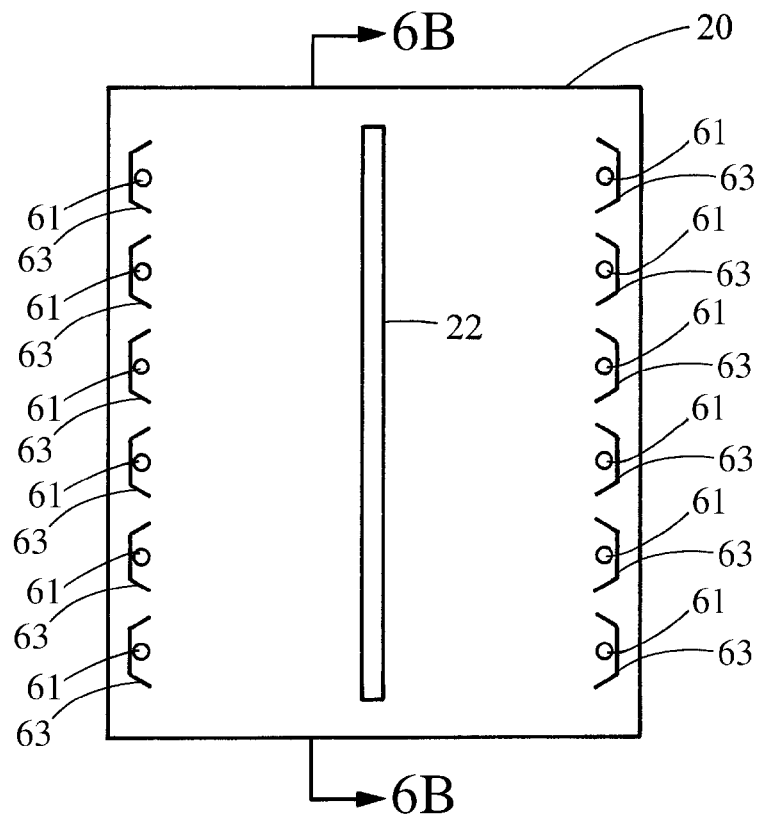
FIG. 6A depicts a coarse heater of the system of FIG. 1 in accordance with an embodiment of the invention.
Figure 6B:
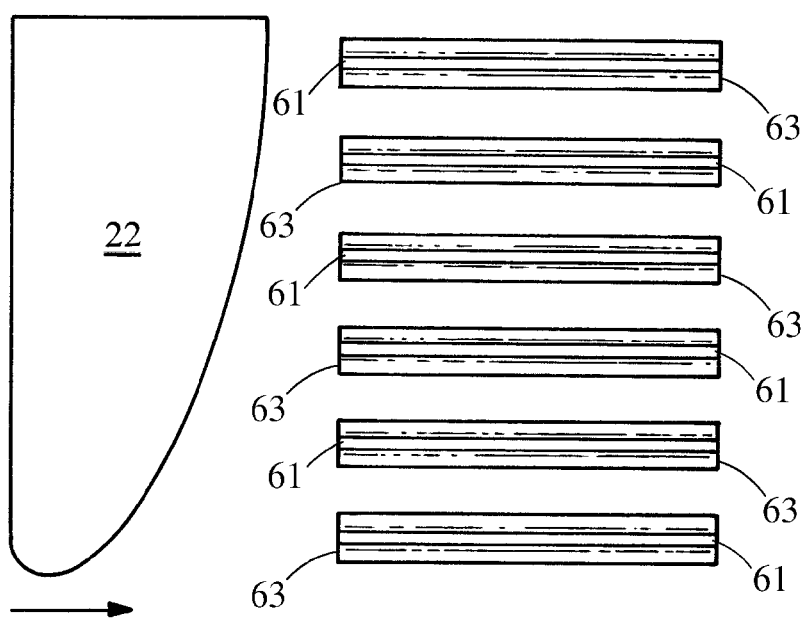
FIG. 6B is a view of the coarse heater of FIG. 6A taken along the line 6B-6B.

Provision for the coarse heater 20 is optional. For the coarse heater 20, fast response time and small spot size are not required. Thus, as shown in FIGS. 6A and 6B, the course heater includes, for example, a set of longitudinal heat sources 61 and associated reflectors 63 that raise the substrate temperature part way to a desired temperature, without targeting a particular temperature profile. A purpose of the coarse heater 20 is to reduce the burden on, and in some cases the length in the direction of substrate motion of, the programmable array of heat sources 50 in the fine heater 16. Accordingly, the coarse heater 20 is located upstream of the fine heater 16 so that the substrate first passes the coarse heater before advancing through the fine heater.

The system 10 may also provide for in-situ measurement of the local substrate temperature, for example, through the use of a series of infrared temperature sensors 62 (FIG. I), following substrate exposure to the programmable fine heater 16, and optionally following the coating station 12, the fine make-up heater 18, and the second coating station 14. These temperature measurements help characterize the substrate temperature profile before (and optionally after) the plasma coating process. This profile can be used to adjust the program of the programmable array of heat sources 50 to establish the program appropriate for a specific substrate prior to actual production. Alternatively, the profile can be monitored during production to allow real-time adjustment of the program to maintain a desired temperature profile.

The system 10 is also able to identify the type and shape of substrate to be heated and then recall from a library of information or a database the appropriate program for the array of heat sources 50, a feature which may be of interest if different substrates are to be coated in a common production run.

In certain implementations, the energy output of each heat source 50 is between about 200 W to 400 W. The heat sources 50 can be spaced apart (center to center) between about 3 inches to 6 inches. Any suitable lamp that provides the necessary energy and spot size may be used. For example, the heat sources 50 may be quartz lamps or halogen lamps.

In particular implementations, the substrates are heated in the heaters 16, 18 while stationary. Specifically, the conveyor system moves a substrate into the heaters 16, 18, and the substrate then remains stationary as selected heat sources 50 in the presence of the substrate turn on. This implementation allows for a simplified control system, a shorter array of heat sources in the direction of movement of the substrates, and hence a shorter overall footprint for the system 10.

The above and other implementations are within the scope of the following claims.

What is claimed is:

1. An apparatus for coating a substrate comprising:
an array of plasma arcs;
a first plurality of reagent manifolds located upstream of the array of plasma arcs and a second plurality of reagent manifolds located downstream of the array of plasma arcs, each manifold having an orifice configured to eject a reagent into a plasma jet when it issues from a respective plasma arc; and a controller configured to modulate the flow of reagent to each manifold according to the contours of the substrate and to the substrate position relative to the plasma arcs and the manifolds.

2. The apparatus of claim 1, further comprising a second array of plasma arcs, a third plurality of reagent manifolds located upstream of the second array of plasma arcs, and a fourth plurality of reagent manifolds located downstream of the second array of plasma arcs, each of the third and fourth plurality of reagent manifolds having an orifice configured to eject a reagent into a plasma jet when it issues from a respective plasma arc directed towards an opposite surface of the substrate under the direction of the controller.

3. The apparatus of claim 1, wherein the substrate advances with a filler surrounding a substantial portion of the edges of the substrate.

4. The apparatus of claim 1, further comprising a vacuum chamber, the manifolds being located in the vacuum chamber.

5. The apparatus of claim 1, further comprising a valve associated with each manifold, the controller modulating the flow of reagent to the individual manifolds by controlling the operation of the respective valves.

6. The apparatus of claim 1, further comprising a reservoir configured to supply reagent for the manifolds.

7. The apparatus of claim 1, further comprising a condensation vessel which receives reagent diverted away from the manifolds.

8. The apparatus of claim 7, wherein the condensation vessel condenses the reagent.

9. A method of coating a substrate with a reagent comprising:
    ejecting a reagent from a first plurality of reagent manifolds located upstream of an array of plasma arcs;
    ejecting the reagent from a second plurality of reagent manifolds located downstream of the array of plasma arcs,
    each of the manifolds of the first and second plurality of reagent manifolds having an orifice configured to eject a reagent into a plasma jet when it issues from a respective plasma arc; and
    modulating the flow of reagent to each manifold with a controller according to the contours of the substrate and to the substrate position relative to the plasma arcs and manifolds.

10. The method of claim 9, further comprising ejecting the reagent from a third plurality of reagent manifolds located upstream of a second array of plasma arcs, and ejecting the reagent from a fourth plurality of reagent manifolds located downstream of the second array of plasma arcs, each of the manifolds of the third and fourth plurality of reagent manifolds having an orifice configured to eject a reagent into a plasma jet when it issues from a respective plasma arc directed towards an opposite surface of the substrate under the direction of the controller.

11. The method of claim 9, wherein the modulating includes controlling the operation of a valve associated with each manifold.

12. The method of claim 9, further comprising supplying reagent to the manifolds from a reservoir.

13. The method of claim 9, wherein a condensation vessel receives reagent diverted away from the manifolds.

14. The method of claim 13, wherein the condensation vessel condenses the reagent.

* * * * *